(12) United States Patent
Ichimura (10) Patent No.: US 7,224,014 B2
(45) Date of Patent: May 29, 2007

(54) SEMICONDUCTOR DEVICE AND METHOD FOR FABRICATING THE SAME

(75) Inventor: Hideo Ichimura, Niigata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 231 days.

(21) Appl. No.: 11/001,044

(22) Filed: Dec. 2, 2004

(65) Prior Publication Data

US 2005/0124114 A1    Jun. 9, 2005

(30) Foreign Application Priority Data

Dec. 5, 2003    (JP) .............. 2003-407226

(51) Int. Cl.
*H01L 27/108* (2006.01)
*H01L 29/76* (2006.01)
*H01L 29/94* (2006.01)
*H01L 31/119* (2006.01)

(52) U.S. Cl. .............. 257/301; 257/532; 257/534; 438/238; 438/243; 438/244

(58) Field of Classification Search .............. 438/238, 438/243, 244, 329, 386, 387; 257/301, 532, 257/534
See application file for complete search history.

(56) References Cited

U.S. PATENT DOCUMENTS 6,627,938 B2 *   9/2003   Kwok et al. .............. 257/301

FOREIGN PATENT DOCUMENTS

JP    10-079478 A    3/1998
JP    10-144880 A    5/1998

\* cited by examiner

*Primary Examiner*—Fernando L. Toledo
(74) *Attorney, Agent, or Firm*—McDermott Will & Emery LLP (57) ABSTRACT

A semiconductor device includes a first insulating film having a cavity, a second insulating film formed on the first insulating film and having an opening exposing the cavity, a lower electrode of a concave shape in cross section formed on the bottom and sides of the cavity, a capacitive insulating film formed on the lower electrode, and an upper electrode formed on the capacitive insulating film. The diameter of the cavity of the first insulating film is larger than that of the opening of the second insulating film, and the end of the second insulating film located on the sides of the opening is formed in an eaves-like part to project like eaves inwardly beyond the sides of the first insulating film.

16 Claims, 6 Drawing Sheets

SEMICONDUCTOR DEVICE AND METHOD FOR FABRICATING THE SAME

CROSS-REFERENCE TO RELATED APPLICATIONS

The disclosure of Japanese Patent Application No. 2003-407226 filed Dec. 5, 2003 including specification, drawing and claims is incorporated herein by reference in its entirety.

BACKGROUND OF THE INVENTION (1) Field of the Invention

The present invention relates to a semiconductor device and a method for fabricating the same, and more particularly relates to a semiconductor device, such as a dynamic random access memory (DRAM) device, having a stacked capacitor structure obtained by stacking films constituting a memory cell capacitor above a transistor and a method for fabricating the same.

(2) Description of Related Art

In recent years, attempts have been made to meet the need for increasing storage capacity in DRAM devices by increasing the storage capacity of memory cells per unit area occupied in a DRAM chip to decrease the area occupied by the memory cells and reduce the DRAM chip size.

As a stacked capacitor structure of a known DRAM device, a capacitor electrode structure has been suggested in which an interlayer insulating film formed on a MIS transistor has a trench part and a lower electrode of a concave shape in cross section is formed on the trench part (see, for example, Japanese Unexamined Patent Publication No. 10-79478).

Figure 5:
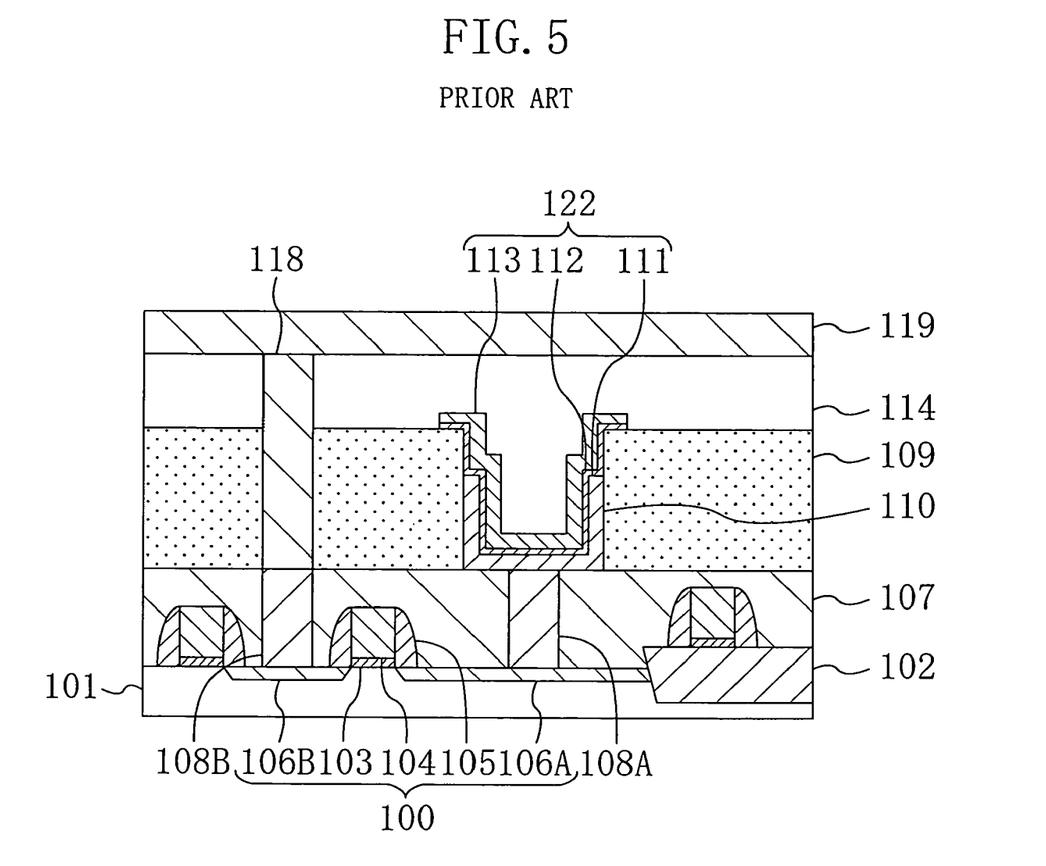
FIG. 5 is a cross-sectional view showing the structure of the principal part of a known semiconductor device.

FIG. 5 shows the cross-sectional structure of a known semiconductor device having a stacked capacitor structure. As shown in FIG. 5, the known semiconductor device comprises a plurality of MIS transistors 100 and capacitors 122. The MIS transistors 100 are formed on active regions of the principal surface of a semiconductor substrate 101 defined by a shallow trench isolation 102, respectively, and serve as switch transistors. The capacitors 122 are formed above the corresponding MIS transistors 100 with a first interlayer insulating film 107 interposed therebetween.

Each MIS transistor 100 is composed of a gate insulating film 103 formed on each active region of the semiconductor substrate 101, a gate electrode 104 formed thereon, insulative sidewalls 105 formed on the side surfaces of the gate electrode 104, and a source region 106A and a drain region 106B formed in the upper part of the active region.

The capacitor 122 is formed by successively stacking a lower electrode 111, a capacitive insulating film 112 and an upper electrode 113 of concave shapes in cross section on a trench part 110 of a second interlayer insulating film 109 formed on the first interlayer insulating film 107 covering each MIS transistor 100. The lower electrode 111 is electrically connected to the source region 106A of the MIS transistor 100 through a first plug 108A formed in the first interlayer insulating film 107.

A third interlayer insulating film 114 is formed on the second interlayer insulating film 109 to cover the capacitor 122, and a bit interconnect 119 is formed on the third interlayer insulating film 114. The bit interconnect 119 is electrically connected to the drain region 106B of the MIS transistor 100 through a second plug 108B formed in the first interlayer insulating film 107 and a third plug 118 formed in the third interlayer insulating film 114 and the second interlayer insulating film 109.

Next, FIGS. 6A through 6D show process steps in a known method for fabricating a semiconductor device having a stacked capacitor structure. They show only a method for fabricating the capacitor 122.

Figure 6A:
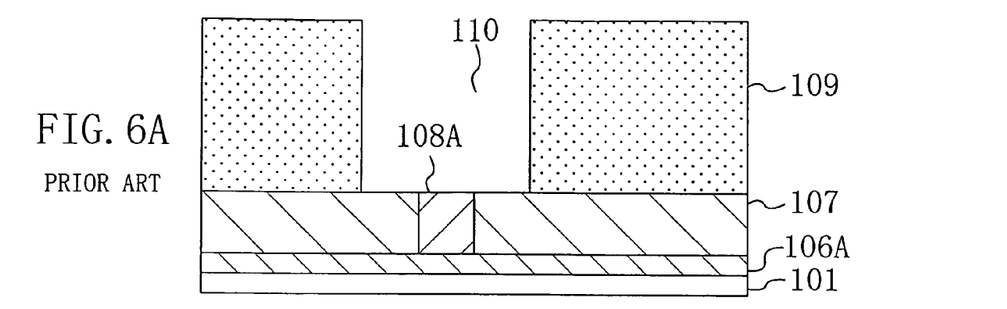
FIGS. 6A through 6D are cross-sectional views showing process steps in a known method for fabricating a semiconductor device.

First, in a process step shown in FIG. 6A, a source region 106A of an unshown MIS transistor is formed in an active region of a semiconductor substrate 101 by ion implantation, and then a first interlayer insulating film 107 is formed to cover the MIS transistor. Subsequently, a contact hole is formed in the first interlayer insulating film 107 to expose the source region 106A, and the formed contact hole is filled with a conductive film to form a first plug 108A. Thereafter, a second interlayer insulating film 109 is formed on the first plug 108A and the first interlayer insulating film 107, and then a trench part 110 is formed in a region of the second interlayer insulating film 109 where a capacitor is to be formed (hereinafter, referred to as a "capacitor formation region") to expose the first plug 108A.

Figure 6B:
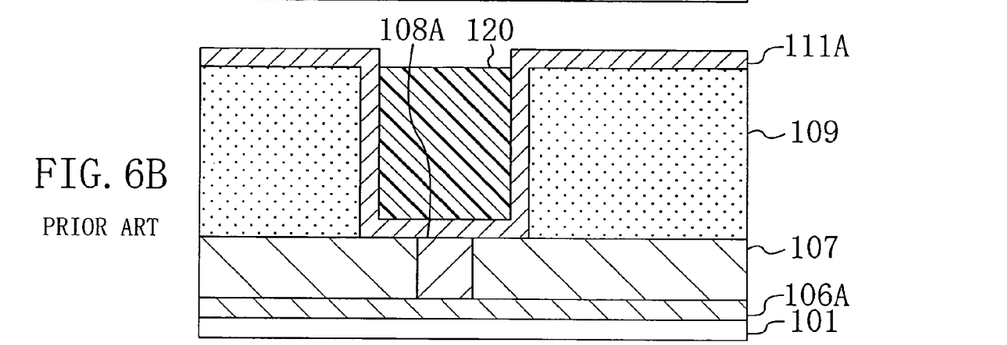

Next, in a process step shown in FIG. 6B, a polysilicon film 111A doped with impurities is formed on the entire surface of the second interlayer insulating film 109 including the trench part 110. Thereafter, the entire surface of the second interlayer insulating film 109 including the trench part 110 is coated with a resist film 120. Subsequently, the coated resist film 120 is etched back by anisotropic dry etching to leave a part of the resist film 120 only inside the trench part 110 in the capacitor formation region.

Figure 6C:
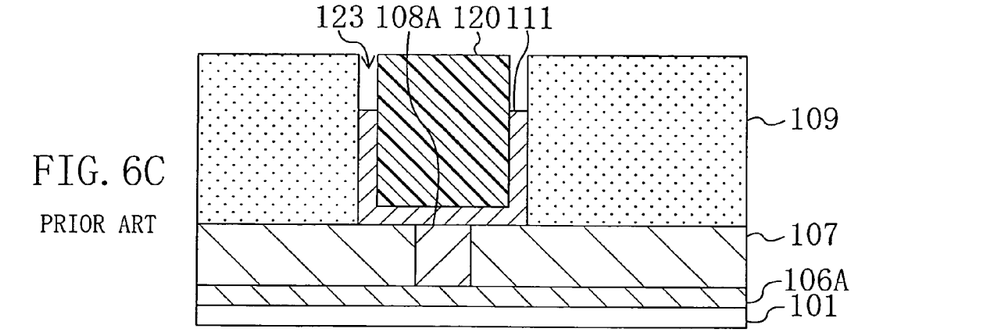

Next, in a process step shown in FIG. 6C, a part of the polysilicon film 111A located on the top surface of the second interlayer insulating film 109 is removed by anisotropic dry etching using the resist mask 120 as a mask. In this way, a lower electrode 111 of a concave shape in cross section is formed inside the trench part 110 of the second interlayer insulating film 109.

Figure 6D:
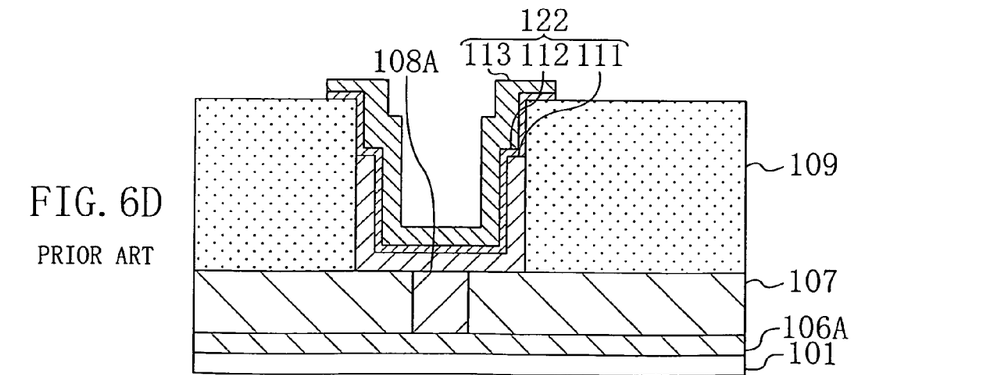

Next, in a process step shown in FIG. 6D, after the removal of the resist film 120, an insulating film for a capacitance and a conductive film for an upper electrode are formed on the second interlayer insulating film 109 and the lower electrode 111. Thereafter, the insulating film for a capacitance and the conductive film for an upper electrode are patterned into a capacitive insulating film 112 and an upper electrode 113, respectively. In this way, a capacitor 112 is composed of the lower electrode 111, the capacitive insulating film 112 and the upper electrode 113.

According to the known method for fabricating the capacitor 122, since as described above the lower electrode 111 has a concave shape in cross section, the side surface area of the capacitor 122 increases, resulting in the increased storage capacity per unit area occupied.

SUMMARY OF THE INVENTION

However, the known method for fabricating a capacitor, i.e., a semiconductor device, has the following problems. According to the known semiconductor device fabricating method, as shown in FIG. 6C, the lower electrode 111 of a concave shape in cross section is formed inside the trench 110 by removing a part of the polysilicon film 111A located on the top surface of the second interlayer insulating film 109 by anisotropic dry etching using the resist film 120 as a mask. In this case, overetching must be performed to prevent the polysilicon film 111A from remaining on the top surface of the second interlayer insulating film 109. This overetching causes that the top ends of the side parts of the lower electrode 111 are removed to form an unexpected recess 123. Therefore, the top end of the lower electrode 111 having a concave shape in cross section has a lower level than the second interlayer insulating film 109, leading to the reduced surface area of the lower electrode 111. As a result, the capacitance of the capacitor 122 decreases. For example, when the polysilicon film 111A has a thickness of 50 nm, the recess 123 is as deep as approximately 150 nm. Furthermore, when roughened polysilicon is further formed on the doped polysilicon to increase the surface area of the lower electrode 111, a deeper recess 123 is formed in the lower electrode 111, because the roughened polysilicon is less etched than the doped polysilicon of which the lower electrode 111 is to be formed. In addition, the depth of the recesses 123 produced by overetching of the polysilicon film 111A is not necessarily uniform within the surface region of the semiconductor substrate 101. This leads to variations in the surface areas of a plurality of lower electrodes 111 formed on the semiconductor substrate 101. As a result, capacitors cannot have a desired capacitance with stability.

An object of the present invention is to allow capacitors each having a lower electrode of a concave shape in cross section to have a desired capacitance with stability.

In order to achieve the above object, a semiconductor device of the present invention has the following structure. A protective insulating film is formed on an insulating film constituting a lower electrode of a concave shape in cross section, and an opening is provided in the formed protective insulating film projecting, like eaves, further than the end of the cavity of the insulating film to cover the periphery thereof.

To be specific, a semiconductor device of the present invention comprises: a first insulating film having a cavity; a second insulating film formed on the first insulating film and having an opening exposing the cavity; a lower electrode of a concave shape in cross section formed on the bottom and sides of the cavity; a capacitive insulating film formed on the lower electrode; and an upper electrode formed on the capacitive insulating film, wherein the diameter of the cavity of the first insulating film is larger than that of the opening of the second insulating film, and the end of the second insulating film located on the sides of the opening is formed in an eaves-like part to project like eaves inwardly beyond the sides of the first insulating film.

According to the semiconductor device of the present invention, the end of the second insulating film located on the sides of the opening is formed in an eaves-like part to project like eaves inwardly beyond the sides of the cavity of the first insulating film. Therefore, the side parts of the lower electrode of a concave shape in cross section formed on the bottom and sides of the cavity of the first insulating film are located under the eaves-like part of the second insulating film. This prevents the top ends of the side parts of the lower electrode of a concave shape in cross section from being etched even if a film for the formation of the lower electrode is over-etched during the formation of the lower electrode. As a result, the surface area of the lower electrode has a fixed value. Furthermore, the surface areas of lower electrodes on the semiconductor substrate do not vary. Thus, capacitors can have a desired capacitance with stability.

In the semiconductor device of the present invention, the width of the eaves-like part of the second insulating film projecting beyond the sides of the cavity is preferably equal to or wider than the thickness of the lower electrode.

In the semiconductor device of the present invention, the thickness of the second insulating film is preferably smaller than that of the first insulating film.

In the semiconductor device of the present invention, it is preferable that the first insulating film is a BPSG film and the second insulating film is a silicon oxide film containing no impurity or silicon nitride film. In this case, if wet etching is used for the formation of the eaves-like part of the second insulating film around the periphery of the opening, the eaves-like part can certainly be formed in the second insulating film. The reason for this is that the etch rate of the silicon oxide film containing no impurity or silicon nitride film is smaller (slower) than that of the BPSG film doped with boron and phosphorus.

In the semiconductor device of the present invention, it is preferable that the lower electrode is made of a doped polysilicon film and roughened polysilicon is formed on the surface of the lower electrode. Thus, this roughened polysilicon increases the surface area of the lower electrode, resulting in the increased capacitance of a capacitor.

In the semiconductor device of the present invention, a part of the roughened polysilicon located on the sides of the cavity of the first insulating film is preferably located under the eaves-like part of the second insulating film. The roughened polysilicon formed on the surface of the lower electrode is also not etched during overetching.

A method for fabricating a semiconductor device of the present invention comprises the steps of: (a) forming a first insulating film on a semiconductor substrate; (b) forming a second insulating film on the first insulating film; (c) forming an opening in the second insulating film and forming a cavity in the first insulating film through the opening; (d) etching the cavity of the first insulating film exposed at the opening using the second insulating film as a mask after the step (c) such that the diameter of the cavity becomes larger than that of the opening of the second insulating film, thereby forming the end of the second insulating film located on the sides of the opening in an eaves-like part to project inwardly beyond the sides of the cavity of the first insulating film; (e) forming a conductive film for a lower electrode on the second insulating film and the bottom and sides of the cavity after the step (d); (f) allowing a resist to fill the cavity in which the conductive film for a lower electrode is formed after the step (e); (g) etching a part of the conductive film for a lower electrode located on the second insulating film using the resist as a mask, thereby forming, in the cavity, a lower electrode of a concave shape in cross section made of the conductive film; (h) forming a capacitive insulating film on the lower electrode; and (i) forming an upper electrode on the capacitive insulating film.

According to the method of the present invention, the eaves-like part is formed in the second insulating film formed on the first insulating film. Therefore, the top ends of the side parts of the lower electrode of a concave shape in cross section is not etched even during the overetching of the conductive film for a lower electrode for the formation of the lower electrode. As a result, the surface area of the lower electrode has a fixed value. Furthermore, the surface areas of lower electrodes on the semiconductor substrate do not vary. Thus, capacitors can have a desired capacitance with stability.

In the method of the present invention, the etch rate of the second insulating film is preferably smaller (slower) than that of the first insulating film.

In the method of the present invention, in the step (d), the eaves-like part of the second insulating film is preferably formed such that the width of the eaves-like part of the second insulating film projecting beyond the sides of the cavity is equal to or wider than the thickness of the conductive film for a lower electrode.

In the method of the present invention, it is preferable that the first insulating film is a BPSG film and the second insulating film is a silicon oxide film containing no impurity or silicon nitride film.

In the method of the present invention, it is preferable that the conductive film for a lower electrode is a doped polysilicon film and the method further comprises the step of forming roughened polysilicon on the surface of the doped polysilicon film after the step (e) and before the step (f).

In the method of the present invention, in the step (d), the cavity of the first insulating film is preferably formed such that a part of the roughened polysilicon located on the sides of the cavity of the first insulating film is located under the eaves-like part of the second insulating film.

DETAILED DESCRIPTION OF THE INVENTION

An embodiment of the present invention will be described hereinafter with reference to the drawings.

Figure 1:
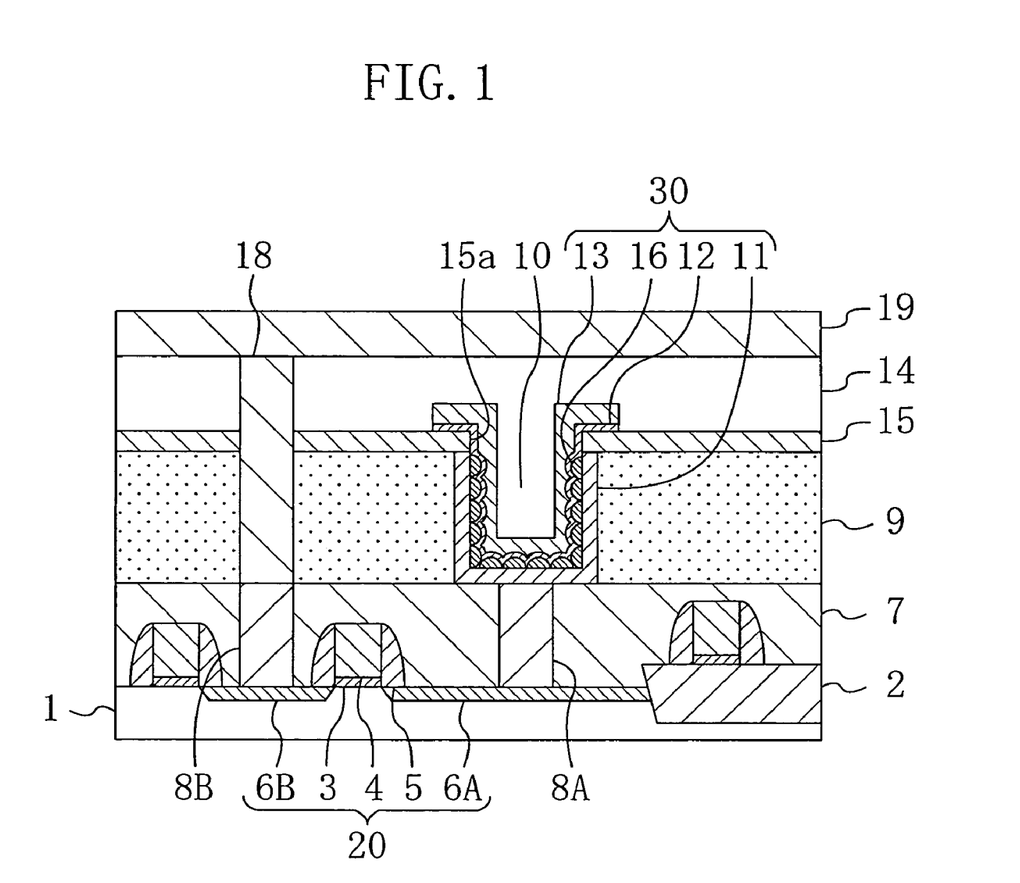
FIG. 1 is a cross-sectional view showing the structure of the principal part of a semiconductor device according to an embodiment of the present invention.

FIG. 1 shows the cross-sectional structure of a semiconductor device according to an embodiment of the present invention. As shown in FIG. 1, a semiconductor device comprises a shallow trench isolation 2 selectively formed in the principal surface of a semiconductor substrate 1, a plurality of MIS transistors 20 serving as switch transistors and formed on corresponding active regions defined by the shallow trench isolation 2, capacitors 30 formed above the individual MIS transistors 20 with a first interlayer insulating film 7 interposed therebetween.

Each MIS transistor 20 is composed of a gate insulating film 3 formed on each active region of the semiconductor substrate 1, a gate electrode 4 formed thereon, insulative sidewalls 5 formed on the side surfaces of the gate electrode 4, and a source region 6A and a drain region 6B formed in the upper part of the active region by ion implantation and made of an impurity diffusion layer.

Each capacitor 30 is composed of a lower electrode 11 of a concave shape in cross section, for example, a bottomed cylindrical shape, formed on the bottom and side surfaces of each cavity 10 of a second interlayer insulating film 9 formed on the first interlayer insulating film 7 covering the MIS transistors 20, and a capacitive insulating film 12 and an upper electrode 13 successively formed on the lower electrode 11. A roughened polysilicon film 16 of hemispherical grains (HSG) is formed on the internal surface of the lower electrode 11, resulting in the further increased surface area of the lower electrode 11. Furthermore, the lower electrode 11 is electrically connected to the source region 6A of the MIS transistor 20 through a first plug 8A formed in the first interlayer insulating film 7.

In this embodiment, the polysilicon doped with phosphorus (P) or arsenic (As) is used for the lower electrode 11 and the upper electrode 13. A so-called ONO film obtained by interposing a silicon nitride film between silicon oxide films is used for the capacitive insulating film 12. However, the components of the lower electrode 11, the upper electrode 13 and the capacitive insulating film 12 are not limited thereto. More particularly, tantalum oxide ($Ta_2O_5$) serving as a highly dielectric material may be used for the capacitive insulating film 12, and in this case titanium nitride (TiN) can be used for the upper electrode 13. Alternatively, when a metal oxide such as tantalum oxide ($Ta_2O_5$), aluminum oxide ($Al_2O_3$) or hafnium oxide ($HfO_2$) is used for the capacitive insulating film 12, titanium nitride may be used for the lower electrode 11 and the upper electrode 13. Furthermore, a metal oxide containing at least two of tantalum, aluminum and hafnium can also be used for the capacitive insulating film 12.

This embodiment is characterized in that a protective insulating film 15 is formed between the second interlayer insulating film 9 and a third interlayer insulating film 14 to have an opening 15a exposing the cavity 10 of the second interlayer insulating film 9. The end of the protective insulating film 15 located on the sides of the opening 15a is formed in an eaves-like part to project like eaves inwardly beyond the sides of the second interlayer insulating film 9.

A third interlayer insulating film 14 is formed on the protective insulating film 15 to cover the capacitor 30. A bit interconnect 19 is formed on the third interlayer insulating film 14 and electrically connected to the drain region 6B of each MIS transistor 20 through a second plug 8B passing through the first interlayer insulating film 7 and a third plug 18 passing through the third interlayer insulating film 14, the protective insulating film 15 and the second interlayer insulating film 9.

Since in this embodiment the protective insulating film 15 is formed on the second interlayer insulating film 9 and the end of the protective insulating film 15 located on the sides of the opening 15a project like eaves inwardly, this prevents the lower electrode 11 formed on the sides of the cavity 10 from being etched by overetching during the formation of the lower electrode 11. Thus, the levels of the top ends of the side parts of the lower electrode 11 having a concave shape in cross section do not depend on the period during which the lower electrode 11 is over-etched. This prevents both the decrease and variations in the surface areas of the lower electrode 11. Therefore, capacitors can have a desired capacitance with stability.

A method for fabricating a semiconductor device as constructed above will be described hereinafter with reference to the drawings.

FIGS. 2A through 3C, 4A and 4B are cross-sectional views showing process steps in a method for fabricating a semiconductor device according to an embodiment of the present invention step by step.

Figure 2A:
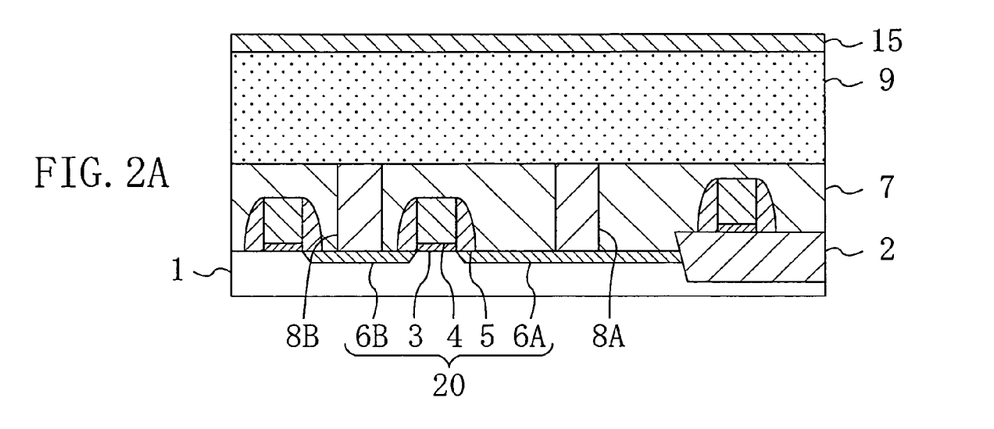
FIGS. 2A through 2C are cross-sectional views showing some of process steps in a method for fabricating a semiconductor device according to the embodiment of the present invention step by step.

First, in a process step shown in FIG. 2A, a shallow trench isolation 2 of silicon oxide is formed in the upper part of a semiconductor substrate 1 of, for example, P-type silicon. Thereafter, a gate insulating film 3 of silicon oxide and a gate electrode 4 of polysilicon doped with phosphorus (P)

are successively formed on an active region of the semiconductor substrate 1 surrounded by the shallow trench isolation 2. Next, insulative sidewalls 5 are formed on both sides of the gate electrode 4, respectively, and then an N-type source region 6A and an N-type drain region 6B are formed by implanting N-type impurity ions into the semiconductor substrate 1 using the gate electrode 4 and the sidewalls 5 as masks. In this way, a MIS transistor 20 is formed which serves as a switch transistor of a memory cell. Subsequently, a first interlayer insulating film 7 is formed on the semiconductor substrate 1 to cover the MIS transistor 20, and its top surface is planarized. Thereafter, contact holes are formed in the first interlayer insulating film 7 to expose the source region 6A and the drain region 6B of the MIS transistor 20, respectively. Subsequently, a first plug 8A connected to the source region 6A and a second plug 8B connected to the drain region 6B are formed by filling the insides of the contact holes with a conductive material made of N-type polysilicon. Then, a second interlayer insulating film 9 made of Boro-Phospho-Silicate Glass (BPSG) is formed on the first interlayer insulating film 7, for example, by chemical vapor deposition (CVD), to have a thickness of approximately 600 nm. Then, a protective insulating film 15 made of silicon oxide containing no impurity (High-Density-Plasma Non-Silicate Glass (HDP-NSG)) and having a smaller wet-etch rate than the BPSG is formed on the second interlayer insulating film 9 to have a thickness of approximately 10 nm. In this embodiment, the protective insulating film 15 is not limited to HDP-NSG. An insulating film having a smaller wet-etch rate than the component of the second interlayer insulating film 9, for example, an insulating film such as silicon nitride, may be used for the protective insulating film 15.

Figure 2B:
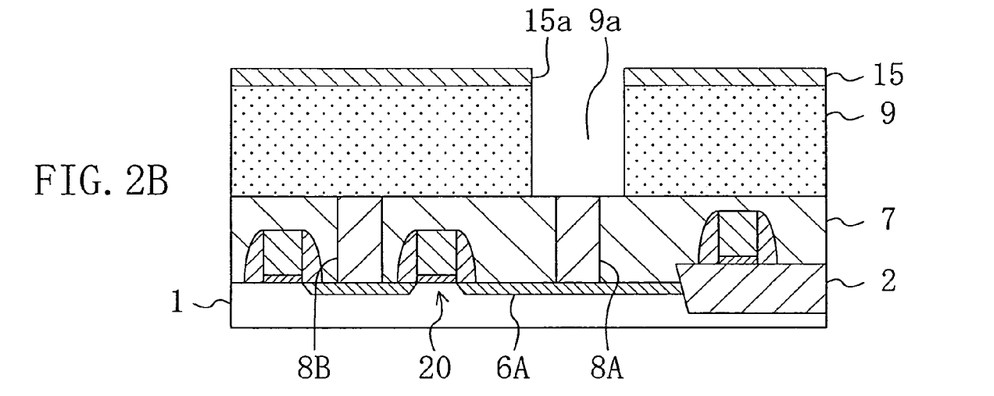

Next, in a process step shown in FIG. 2B, parts of the second interlayer insulating film 9 and the protective insulating film 15 located above the source region 6A of the MIS transistor 20 is subjected to anisotropic dry etching by an etching gas with fluorocarbon as the main ingredient. In this way, openings 9a and 15a are formed to pass through the second interlayer insulating film 9 and the protective insulating film 15 and expose the first plug 8A.

Figure 2C:
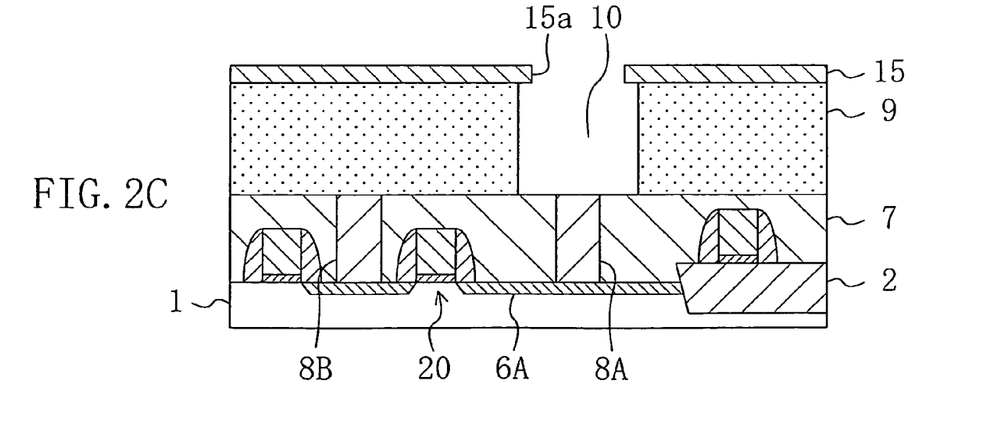

Next, in a process step shown in FIG. 2C, the second interlayer insulating film 9 exposed at the opening 9a is subjected to isotropic wet etching using, for example, a hydrofluoric-acid-containing solution with the protective insulating film 15 used as a mask. In this way, the side surfaces of the opening 9a of the second interlayer insulating film 9 are set a predetermined distance, for example, 75 nm, back from the edges of the opening 15a of the protective insulating film 15. In this way, a cavity 10 is formed in the second interlayer insulating film 9 to have a larger width than that of the opening 15a of the protective insulating film 15. As a result, the end of the protective insulating film 15 located on the sides of the opening 15a is formed into an eaves-like part to project like eaves beyond the side surfaces of the second interlayer insulating film 9. The above wet etching simultaneously permits the removal of a natural oxide film formed on the surface of the first plug 8A exposed at the cavity 10.

It is preferable that the amount of setback of the cavity 10 in the second interlayer insulating film 9, i.e., the width of the eaves-like part of the protective insulating film 15 projecting beyond the end of the second interlayer insulating film 9 toward the inside of the opening 15a of the protective insulating film 15, is set equal to or wider than the thickness of a conductive film for a lower electrode that will be formed in a later process step.

Although in this embodiment wet etching is used as etching for the formation of the eaves-like part of the protective insulating film 15, dry etching can be used thereas. This is possible, for example, if a mixed gas of carbon tetrafluoride ($CF_4$) and oxygen ($O_2$) is used as an etching gas.

Figure 3A:
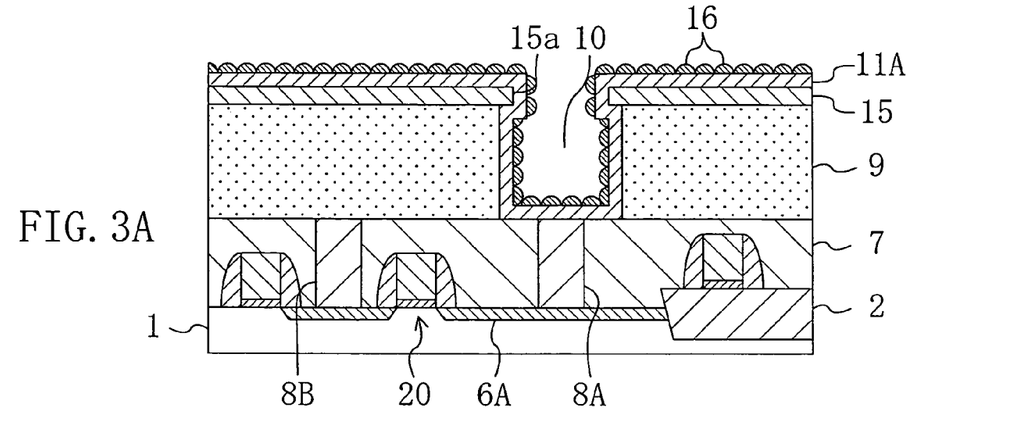
FIGS. 3A through 3C are cross-sectional views showing some of process steps in a method for fabricating a semiconductor device according to the embodiment of the present invention step by step.

Next, in a process step shown in FIG. 3A, a conductive film 11A for a lower electrode, for example, made of polysilicon doped with phosphorus, is formed over both the entire surfaces of the protective insulating film 15 and the cavity 10 of the second interlayer insulating film 9 by low-pressure chemical deposition to have a thickness of approximately 25 nm. In this case, it can be formed with an excellent coverage even over the edges of the opening 15a of the protective insulating film 15 and the side surfaces of the cavity 10 of the second interlayer insulating film 9. Thereafter, an amorphous silicon film is deposited on the conductive film 11A for a lower electrode by low pressure CVD to have a thickness of approximately 25 run, and then the deposited amorphous silicon film is subjected to heat treatment so as to be turned (roughened) into HSGs. As a result, a large number of HSGs (roughened polysilicon) 16 are formed on the conductive film 11A for a lower electrode. In order to prevent the conductive film 11A for a lower electrode from being depleted, the amorphous silicon film may be doped with phosphorus or the like during the deposition of the amorphous silicon film.

Figure 3B:
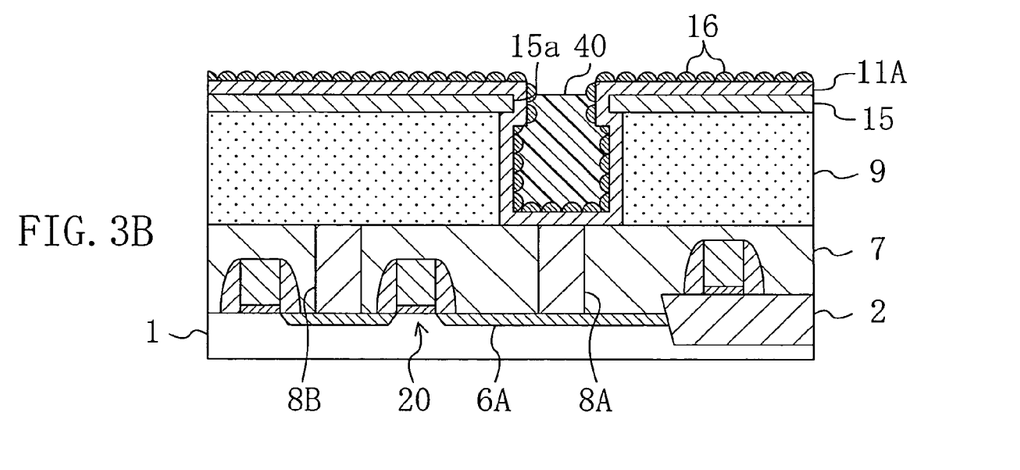

Next, in a process step shown in FIG. 3B, the surfaces of the HSGs 16 including the inside of the cavity 10 are coated with a resist film 40, and then the resist film 40 is etched back by anisotropic dry etching using an etching gas containing an oxygen gas as the main ingredient. In this case, the resist film 40 is left only in the cavity 10 of the second interlayer insulating film 9.

Figure 3C:
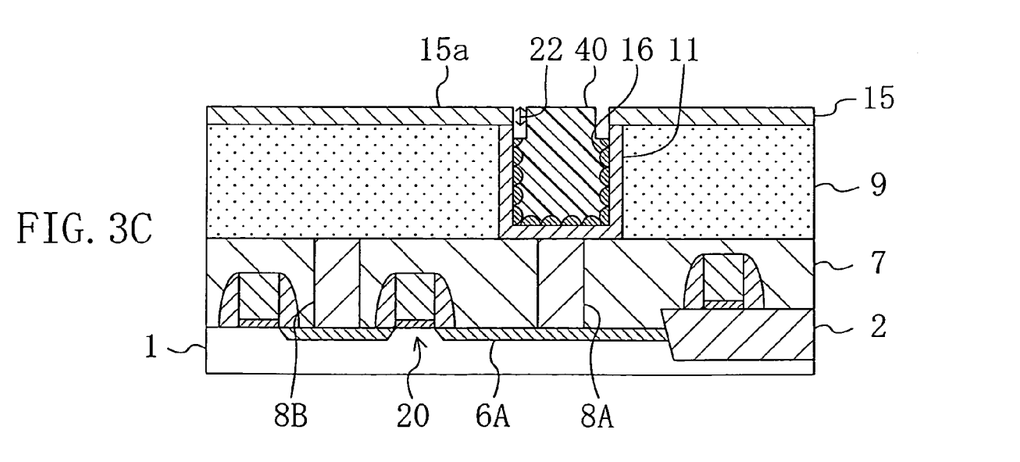

Next, in a process step shown in FIG. 3C, some of the HSGs 16 and a part of the conductive film 11A for a lower electrode both located above the second interlayer insulating film 9 are removed by anisotropic dry etching using an etching gas of chlorine ($Cl_2$) or hydrogen bromide (HBr) or an etching gas of a halogen gas having at least one of $Cl_2$ and HBr as the main ingredient and doped with oxygen ($O_2$), such as $Cl_2/O_2$, $Cl_2/HBr/O_2$ or $HBr/O_2$, by using the resist film 40 remaining inside the cavity 10 as a mask. In this way, a lower electrode 11 of a concave shape in cross section having the HSGs 16 is formed on the bottom and sides of the cavity 10 of the second interlayer insulating film 9. This embodiment is characterized in that even if overetching is performed on the conductive film 11A for a lower electrode, the depth 22 of recesses of the lower electrode 11 (hereinafter, referred to as a "recess depth 22") can have a fixed value. The reason for this is that the eaves-like part of the protective insulating film 15 interferes with the entry of etching ions into at least a part of the conductive film 11A formed under the eaves-like part. Therefore, although the lower electrode 11 has a recess depth 22 from the top surface of the protective insulating film 15 corresponding to the thickness of the protective insulating film 15, it is hardly recessed from the level of the top surface of the interlayer insulating film 9.

In this embodiment, HSGs (roughed polysilicon) 16 on the sides of the lower electrode 11 are not located under the eaves-like part of the protective insulating film 15. However, it is preferable that the HSGs 16 on the sides of the lower electrode 11 are located under the eaves-like part of the protective insulating film 15 by increasing the width of the cavity 10 of the second interlayer insulating film 9 enough to put the eaves-like part of the protective insulating film 15 over the HSGs 16.

Figure 4A:
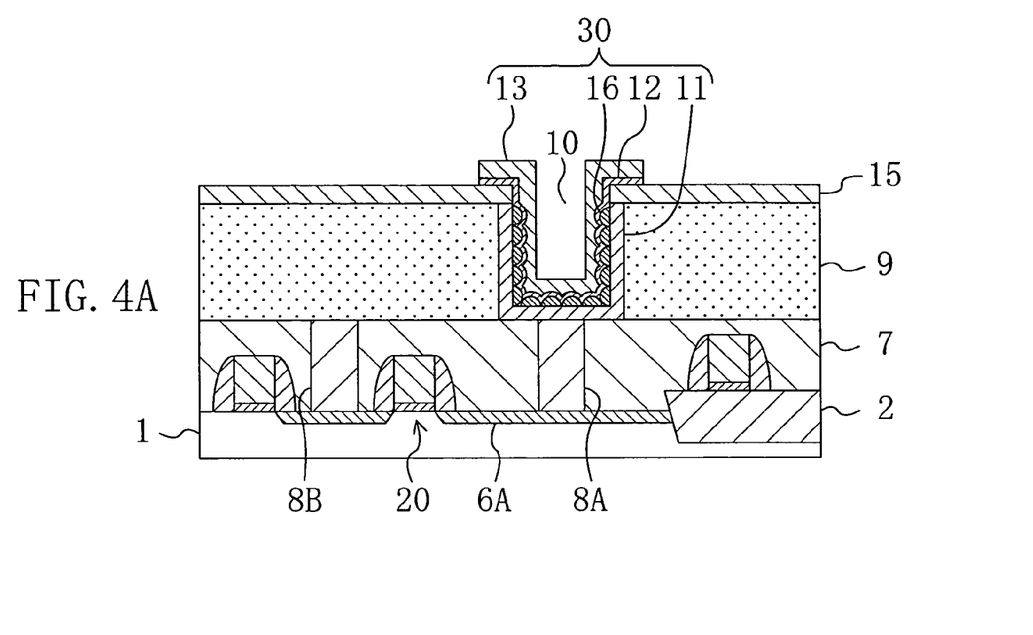
FIGS. 4A and 4B are cross-sectional views showing some of process steps in a method for fabricating a semiconductor device according to the embodiment of the present invention step by step.

Next, in a process step shown in FIG. 4A, after the removal of the resist film 40, an insulating film for a capacitance made of, for example, an ONO film and a conductive film for an upper electrode made of polysilicon doped with phosphorus are deposited over the entire surface of the protective insulating film 15 and the surfaces of the lower electrode 11 and the HSGs 16 by CVD. Thereafter, the deposited insulating film for a capacitance and the deposited conductive film for an upper electrode are patterned into a predetermined shape by lithography and etching so as to be left inside and in the vicinity of the cavity 10, thereby forming a capacitive insulating film 12 and an upper electrode 13. In this way, a capacitor 30 is formed which is composed of the lower electrode 11 having the HSGs 16 in the cavity 10 of the second interlayer insulating film 9, the capacitive insulating film 16 and the upper electrode 13.

Figure 4B:
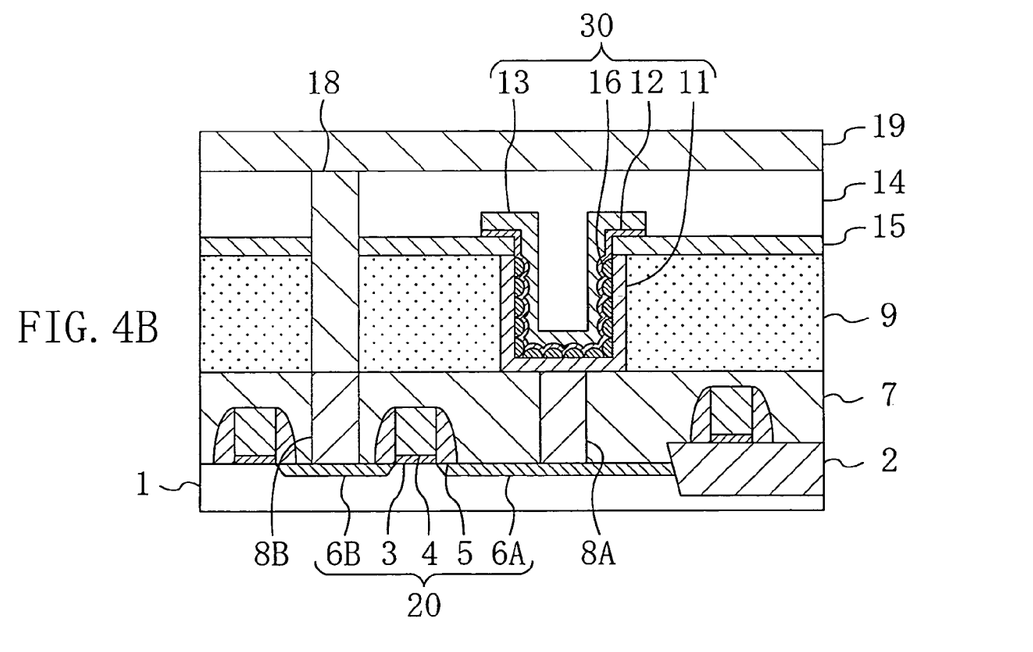

Next, in a process step shown in FIG. 4B, a third interlayer insulating film 14 is deposited on the protective insulating film 15 and the capacitor 30, and then the surface of the deposited third interlayer insulating film 14 is planarized. Subsequently, a third plug 18 is formed which passes through the third interlayer insulating film 14, the protective insulating film 15 and the second interlayer insulating film 9 and is connected to the second plug 8B located on the drain region 6B of the MIS transistor 20. Thereafter, a bit interconnect 19 made of a metal interconnect and connected to the third plug 18 is selectively formed on the third interlayer insulating film 14.

As described above, according to the semiconductor device fabricating method of this embodiment, as shown in FIG. 3C, the protective insulating film 15 is provided on the second interlayer insulating film 9 having the cavity 10 for the formation of the lower electrode 11 of a concave shape in cross section and has the opening 15a covering the upper part of the cavity 10 like eaves. Therefore, the eaves-like part of the protective insulating film 15 can prevent the lower electrode 11 formed on the sides of the cavity 10 of the second interlayer insulating film 9 from being etched by overetching during the formation of the lower electrode 11. Therefore, the levels of the top ends of the side parts of the lower electrode 11 of a concave shape in cross section do not depend on the period during which the lower electrode 11 is over-etched. This does not reduce the surface area of the lower electrode 11 and suppresses variations in the surface area thereof. As a result, the capacitor can have a desired capacitance with stability.

In this embodiment, the HSGs (roughened polysilicon) 16 are formed on the surface of the lower electrode 11. However, the HSGs 16 need not always be formed.

Furthermore, in this embodiment, the lower electrode 11 of the capacitor 30 is connected to the source region 6A of the corresponding MIS transistor 20 through the first plug 8A passing through the first interlayer insulating film 7 covering the MIS transistor 20. However, the lower electrode 11 may be connected directly with the source region 6A without the provision of the first interlayer insulating film 7.

As described above, the semiconductor device and the method for fabricating the same of the present invention provides a predetermined surface area of a lower electrode of a concave shape in cross section and prevents variations in the surface area thereof. Therefore, capacitors can have a desired capacitance with stability. Thus, the semiconductor device and the method for fabricating the same of the present invention are useful for DRAM devices or the like having a stacked capacitor structure.

What is claimed is:

1. A semiconductor device comprising:
   a first insulating film having a cavity;
   a second insulating film formed on the first insulating film and having an opening exposing the cavity;
   a lower electrode of a concave shape in cross section formed on the bottom and sides of the cavity;
   a capacitive insulating film formed on the lower electrode; and
   an upper electrode formed on the capacitive insulating film,
   wherein the diameter of the cavity of the first insulating film is larger than that of the opening of the second insulating film, and the end of the second insulating film located on the sides of the opening is formed in an eaves-like part to project like eaves inwardly beyond the sides of the first insulating film, and
   a height of the top end of the side part of the lower electrode is lower than that of the top end of the second insulating film.

2. The semiconductor device of claim 1, wherein the width of the eaves-like part of the second insulating film projecting beyond the sides of the cavity is equal to or wider than the thickness of the lower electrode.

3. The semiconductor device of claim 1, wherein the thickness of the second insulating film is smaller than that of the first insulating film.

4. The semiconductor device of claim 1, wherein the first insulating film is a BPSG film, and the second insulating film is a silicon oxide film containing no impurity or silicon nitride film.

5. The semiconductor device of claim 1, wherein the lower electrode is made of a doped polysilicon film, and roughened polysilicon is formed on the surface of the lower electrode.

6. The semiconductor device of claim 5, wherein a part of the roughened polysilicon located on the sides of the cavity of the first insulating film is located under the eaves-like pan of the second insulating film.

7. A method for fabricating a semiconductor device, said method comprising the steps of:
   (a) forming a first insulating film on a semiconductor substrate;
   (b) forming a second insulating film on the first insulating film;
   (c) forming an opening in the second insulating film and forming a cavity in the first insulating film through the opening;
   (d) etching the cavity of the first insulating film exposed at the opening using the second insulating film as a mask after the step (c) such that the dienieter of the cavity becomes larger than that of the opening of the second insulating film, thereby forming the end of the second insulating film located on the sides of the opening in an eaves-like part to project inwardly beyond the sides of the cavity of the first insulating film;
   (e) forming a conductive film for a lower electrode on the second insulating film and the bottom and sides of the cavity alter the step (d);
   (f) allowing a resist to fill the cavity in which the conductive film for a lower electrode is formed after the step (e);

(g) etching a part of the conductive film for a lower electrode located on the second insulating film using the resist as a mask, thereby forming, in the cavity, a lower electrode of a concave shape in cross section made of the conductive film;

(h) forming a capacitive insulating film on the lower electrode; and (i) forming an upper electrode on the capacitive insulating film, in the step (g), the lower electrode is formed such that a height of the top end of the side part a the lower electrode is lower than that of the top end of the second insulating film.

8. The method of claim 7, wherein the etch rate of the second insulating film is smaller than that of the first insulating film.

9. The method of claim 7, wherein in the step (d), the eaves-like pan of the second insulating film is formed such that the width of the eaves-like part of the second insulating film projecting beyond the sides of the cavity is equal to or wider than the thickness of the conductive film for a lower electrode.

10. The method of claim 7, wherein the first insulating film is a BPSG film, and the second insulating film is a silicon oxide film containing no impurity or silicon nitride film.

11. The method of claim 7, wherein the conductive film for a lower electrode is a doped polysilicon film, and the method further comprises the step of forming roughened polysilicon on the surface of the doped polysilicon film after the step (e) and before the step (f).

12. The method of claim 11, wherein in the step (d), the cavity of the first insulating film is formed such that a part of the roughened polysilicon located on the sides of the cavity of the first insulating film is located under the eaves-like part of the second insulating film.

13. A semiconductor device comprising:

a first insulating film having a cavity;

a second insulating film formed on the first insulating film and having an opening exposing the cavity;

a lower electrode of a concave shape in cross section formed on the bottom and sides of the cavity;

a capacitive insulating film formed on the lower electrode; and an upper electrode formed on the capacitive insulating film, wherein the diameter of the cavity of the first insulating film is larger than that of the opening of the second insulating film, and the end of the second insulating film located on the sides of the opening is formed in an eaves-like part to project like eaves inwardly beyond the sides of the first insulating film, and the lower electrode is made of a doped polysilicon film, and roughened polysilicon is formed on the surface of the lower electrode.

14. The semiconductor device of claim 13, wherein a part of the roughened polysilicon located on the sides of the cavity of the first insulating film is located under the eaves-like part of the second insulating film.

15. A method for fabricating a semiconductor device, said method comprising the steps of:

(a) forming a first insulating film on a semiconductor substrate;

(b) forming a second insulating film on the first insulating film;

(c) forming an opening in the second insulating film and forming a cavity in the first insulating film through the opening;

(d) etching the cavity of the first insulating film exposed at the opening using the second insulating film as a mask after the step (c) such that the diameter of the cavity becomes larger than that of the opening of the second insulating film, thereby forming the end of the second insulating film located on the sides of the opening in an eaves-like part to project inwardly beyond the sides of the cavity of the first insulating film;

(e) forming a conductive film for a lower electrode on the second insulating film and the bottom and sides of the cavity after the step (d);

(f) allowing a resist to fill the cavity in which the conductive film for a lower electrode is formed after the step (e);

(g) etching a part of the conductive film for a lower electrode located on the second insulating film using the resist as a mask, thereby forming, in the cavity, a lower electrode of a concave shape in cross section made of the conductive film;

(h) forming a capacitive insulating film on the lower electrode; and (i) forming an upper electrode on the capacitive insulating film, wherein the conductive film for a lower electrode is a doped polysilicon film, and the method further comprises the step of forming roughened polysilicon on the surface of the doped polysilicon film after the step (e) and before the step (f).

16. The method of claim 15, wherein in the step (d), the cavity of the first insulating film is formed such that a part of the roughened polysilicon located on the sides of the cavity of the first insulating film is located under the eaves-like part of the second insulating film.

* * * * *